(12) United States Patent
Ishii et al.

(10) Patent No.: US 7,189,625 B2
(45) Date of Patent: Mar. 13, 2007

(54) MICROMACHINE AND MANUFACTURING METHOD

(75) Inventors: Hiromu Ishii, Kanagawa (JP); Yasuyuki Tanabe, Kanagawa (JP); Katsuyuki Machida, Kanagawa (JP); Masami Urano, Kanagawa (JP); Shouji Yagi, Kanagawa (JP); Tomomi Sakata, Saitama (JP)

(73) Assignee: Nippon Telegraph and Telephone Corporation, Tokyo (JP)

(*) Notice: Subject to any disclaimer, the term of this patent is extended or adjusted under 35 U.S.C. 154(b) by 0 days.

(21) Appl. No.: 11/243,550

(22) Filed: Oct. 4, 2005

(65) Prior Publication Data
US 2006/0027839 A1 Feb. 9, 2006

Related U.S. Application Data

(62) Division of application No. 10/446,374, filed on May 28, 2003, now abandoned.

(30) Foreign Application Priority Data

| Jun. 5, 2002 | (JP) | ............................. 2002-164013 |
| Jun. 5, 2002 | (JP) | ............................. 2002-164105 |
| Oct. 10, 2002 | (JP) | ............................. 2002-297847 |

(51) Int. Cl.
 *H01L 21/20* (2006.01)
 *H01L 21/469* (2006.01)
 *H01L 29/82* (2006.01)

(52) U.S. Cl. ..................... 438/381; 438/780; 257/414

(58) Field of Classification Search ............... 438/381, 438/758, 780; 257/414, 415, 417

See application file for complete search history.

(56) References Cited

U.S. PATENT DOCUMENTS

| 5,202,411 | A | 4/1993 | Itatani |
| 5,226,099 | A | 7/1993 | Mignardi et al. |
| 5,502,143 | A | 3/1996 | Oie et al. |
| 6,174,820 | B1 * | 1/2001 | Habermehl et al. ......... 438/745 |
| 6,373,682 | B1 | 4/2002 | Goodwin-Johansson |
| 6,469,602 | B2 * | 10/2002 | Ruan et al. ................... 335/78 |

(Continued)

FOREIGN PATENT DOCUMENTS

JP 64-35643 2/1989

(Continued)

OTHER PUBLICATIONS

Shimaoka et al., "A Full-Dry Processing Technique from Sacrificial Layer Etching to Water-Repellent Coating", Proceedings of The 19th Sensor Symposium, pp. 309-313, 2002.

(Continued)

*Primary Examiner*—T. N. Quach
(74) *Attorney, Agent, or Firm*—Blakely Sokoloff Taylor & Zafman

(57) ABSTRACT

In a micromachine according to this invention, a polyimide film is formed on the surface of each electrode. The polyimide film is formed as follows. A substrate having each electrode and a counterelectrode are dipped in an electrodeposition polyimide solution, and a positive voltage is applied to the electrode. A material dissolved in the electrodeposition polyimide solution is deposited on a surface of the positive-voltage-applied electrode that is exposed in the solution, thus forming a polyimide film on the surface.

8 Claims, 8 Drawing Sheets

U.S. PATENT DOCUMENTS

| | | | |
|---|---|---|---|
| 6,610,440 B1 * | 8/2003 | LaFollette et al. | 429/122 |
| 7,030,494 B2 * | 4/2006 | Aoki | 257/758 |
| 2002/0145185 A1 | 10/2002 | Shrauger | |
| 2002/0164110 A1 | 11/2002 | Neukermans et al. | |
| 2004/0152276 A1 * | 8/2004 | Nishimura | 438/365 |

FOREIGN PATENT DOCUMENTS

| | | |
|---|---|---|
| JP | 1-184533 | 7/1989 |
| JP | 2-230350 | 9/1990 |
| JP | 4-88448 | 3/1992 |
| JP | 4-113421 | 4/1992 |
| JP | 06-230296 | 8/1994 |
| JP | 7152641 | 6/1995 |
| JP | 8-84484 | 3/1996 |
| JP | 9-146774 | 6/1997 |
| JP | 2000-212796 | 2/2000 |
| JP | 2001-198897 | 7/2001 |
| JP | 2001-282542 | 10/2001 |
| JP | 2001-347500 | 12/2001 |
| JP | 2002-050590 | 2/2002 |
| JP | 2002-189178 | 7/2002 |
| JP | 2002-258971 | 9/2002 |
| WO | WO 00/73839 | 12/2000 |

OTHER PUBLICATIONS

Matsumoto et al., "Applications of Newly Developed Positive Photosensitive Block Co-Polymides to CSPs", Electronic Components and Technology Conference, pp. 1610-1615, 2000.

"MEMS: Micro Technology, Mega Impact", Circuit & Device, pp. 14-25, 2001.

* cited by examiner

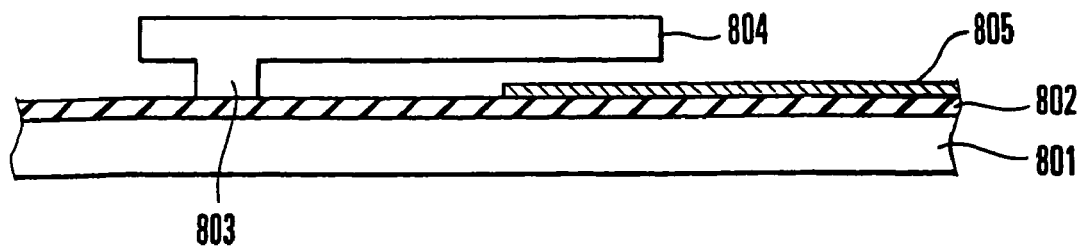
(PRIOR ART)　　FIG.5A
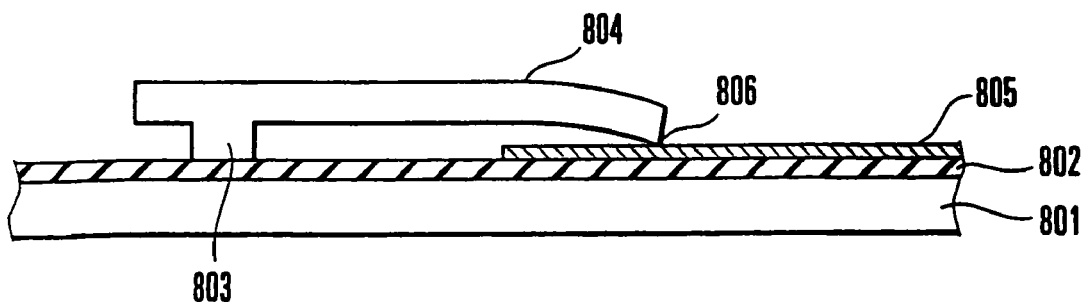
(PRIOR ART)　　FIG.5B
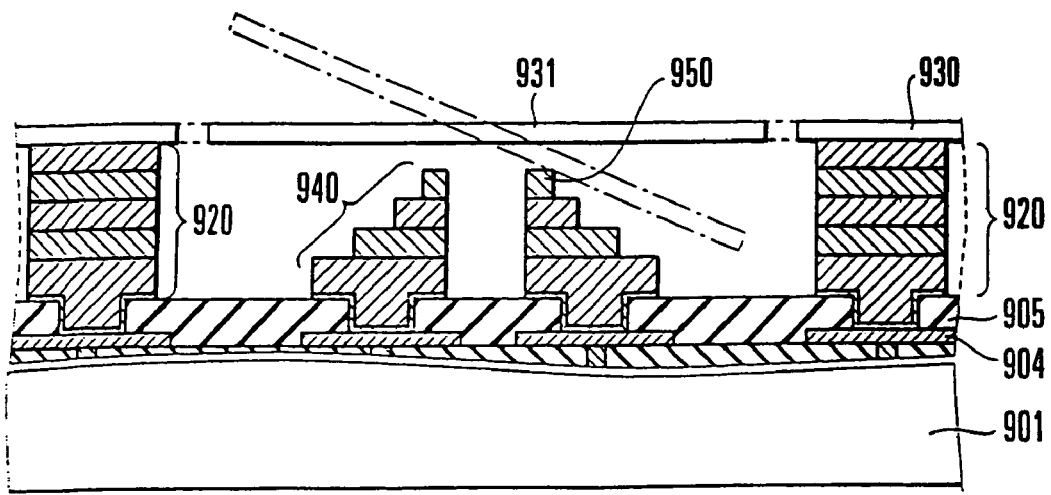
(PRIOR ART)　　FIG.6

MICROMACHINE AND MANUFACTURING METHOD

The application is a divisional of U.S. patent application Ser. No. 10/446,374 filed on May 28, 2003 now abandoned.

BACKGROUND OF THE INVENTION

The present invention relates to a micromachine implemented by MEMS or the like, and a manufacturing method therefor.

One of techniques of implementing a micromachine is MEMS (MicroElectro Mechanical System) (reference 1: Japanese Patent Laid-Open No. 2001-198897, reference 2: Japanese Patent Laid-Open No. 2002-189178, and reference 3: "MEMS: Micro Technology, Mega Impact" Circuit & Device, pp. 14–25 (2001)). MEMS elements realized by MEMS are a switching element which is electrically turned on/off, and an optical switching element which enables/disables an optical signal. In a switching element, a small actuator is formed from silicon or a metal. The actuator is driven by an electrostatic force generated by an electrode which is arranged to face the actuator.

For example, there is a MEMS element shown in FIG. 5A. The MEMS element comprises a silicon actuator 804 which is supported by a support member 803 on a silicon substrate 801 having an insulating film 802. In this element, the actuator 804 is driven by an electrostatic force generated by an electrode 805 arranged on the substrate 801 below the distal end of the actuator 804.

In an optical switching element as one of MEMS elements, a mirror formed from a silicon substrate or the like is driven by an electrostatic force generated by an electrode arranged below the mirror. The optical switching element is constituted as shown in, e.g., FIG. 6. The optical switching element comprises a conductive support member 920 on an interlayer dielectric film 905 formed on a semiconductor substrate 901. The optical switching element also comprises a mirror substrate 930 which is supported by the support member 920 and has an opening region. A mirror 931 is pivotally arranged in the opening region of the mirror substrate 930. A control electrode 940 for pivoting the mirror 931 is arranged on the interlayer dielectric film 905 below the mirror 931. The control electrode 940 and support member 920 are connected to a wiring layer 904 arranged below the interlayer dielectric film 905.

For example, in the MEMS element shown in FIGS. 5A and 5B, it is not easy to attract the actuator 804 to the electrode 805 by an electrostatic force generated by the electrode 805 and keep the actuator 804 still at an arbitrary distance from the underlying electrode 805. This is because the balance between an attractive force of attracting the actuator 804 to the electrode 805 and an elastic force of returning the actuator 804 to an original position is unstable and easily lost. If the balance is lost and, e.g., the attractive force becomes stronger, the distal end of the actuator 804 comes into contact with the surface of the electrode 805.

If the actuator 804 is made of a conductive material and electrically connected to the electrode 805 upon contact, they react with each other and are jointed at a contact portion 806, as shown in FIG. 5B. The actuator 804 may not return to an original position by repulsion of its elastic force. This phenomenon is called sticking or fixation, and poses a problem in driving the actuator of a micromachine. Contact between the actuator and the electrode upon application of a high voltage is identical to so-called spot welding. The cause of this phenomenon is therefore supposed to be a kind of resistance welding.

The optical switching element shown in FIG. 6 also suffers this phenomenon. In this optical switching element, it is not easy to attract one end of the mirror 931 to the control electrode 940 by an electrostatic force generated by the control electrode 940 and keep the mirror 931 still at an arbitrary distance from the underlying control electrode 940. This is because the balance between an attractive force of attracting the mirror 931 to the control electrode 940 and an elastic force of returning the mirror 931 to an original position is unstable and easily lost. If the balance is lost and, e.g., the attractive force becomes stronger, the lower surface of the mirror 931 comes into contact with the end of the control electrode 940.

If the mirror 931 is made of a conductive material and electrically connected to the control electrode 940 upon contact, they react with each other and are jointed at a contact portion 950, as described above. The mirror 931 may not return to an original position by repulsion of its elastic force.

To avoid the sticking phenomenon, at least one contact surface is rendered nonconductive. For this purpose, an organic thin film or the like is formed on an electrode.

For example, before the mirror substrate 930 having the mirror 931 is arranged on the support member 920, an organic material is applied to the interlayer dielectric film 905 having the control electrode 940 and support member 920, thus forming an organic film which covers the control electrode 940. The organic film is also formed on the support member 920 upon coating, and an unnecessary portion must be removed by forming a photosensitive organic film and patterning it by known photolithography.

A complicated three-dimensional structure as shown in FIG. 6 is patterned by photolithography using ultra-deep exposure. Formation of an organic film which covers the control electrode 940 requires many photomasks. A micromachine is greatly corrugated, and the step coverage of a coating film becomes poor in applying an organic material and forming a film. Such poor step coverage may inhibit formation of an organic film in a region where an organic film should be formed, such as a region above the control electrode.

SUMMARY OF THE INVENTION

It is a principal object of the present invention to prevent contact of a movable portion such as an actuator or mirror to a stationary electrode and keep smooth operation by forming more easily than the prior art a protective film on the surface of a structure arranged in a complicated three-dimensional structure.

To achieve the above object, according to one aspect of the present invention, there is provided a micromachine comprising a control electrode formed on a substrate, a movable portion which is arranged above the control electrode at a predetermined distance, and a polyimide film which is formed from polyimide and covers at least one of a surface of the control electrode and a surface of the movable portion.

This arrangement can suppress the sticking phenomenon between the movable portion and the control electrode.

According to another aspect of the present invention, a control electrode is formed on a substrate, a movable portion such as a driving electrode which is insulated from the control electrode and has a portion extending above the control electrode is formed on the substrate, the control electrode and the driving electrode are dipped in an electrodeposition polyimide solution, and a positive voltage is applied to at least one of the control electrode and driving electrode to form a polyimide film by electrodeposition on at least one of the surface of the control electrode and the surface of the driving electrode.

According to this manufacturing method, a polyimide film can be formed even on the surface of a complicated three-dimensional structure.

BRIEF DESCRIPTION OF THE DRAWINGS

FIGS. 5A and 5B are sectional views schematically showing an example of a micromachine; and FIG. 6 is a sectional view schematically showing another example of the micromachine.

DETAILED DESCRIPTION OF THE INVENTION

The simplest embodiments of the present invention will be described below with reference to the accompanying drawings.

First Embodiment

Figure 1A:
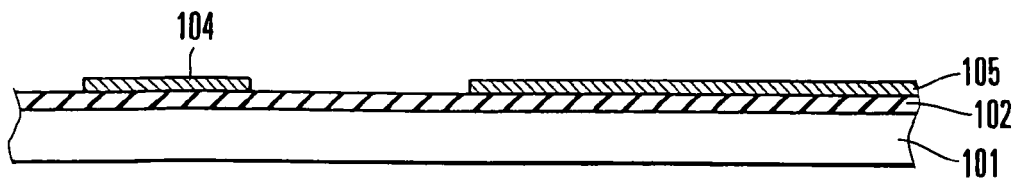
FIGS. 1A to 1E are sectional views showing an example of a micromachine manufacturing method according to the first embodiment of the present invention.

FIGS. 1A to 1E show an example of a micromachine manufacturing method according to the first embodiment of the present invention. The manufacturing method according to the first embodiment will be explained. As shown in FIG. 1A, an insulating film 102 is formed on a silicon substrate 101 by thermal oxidization, CVD, or the like. Au and Cr films are sequentially formed by vapor deposition or the like. These metal films are processed into an electrode 104 and control electrode 105 having desired shapes by known lithography and wet etching.

Figure 1B:
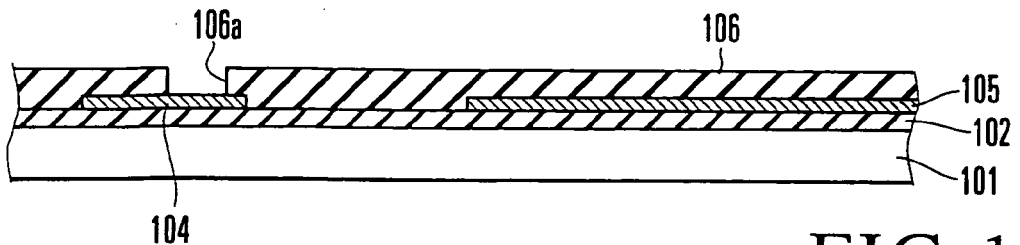
Figure 1C:
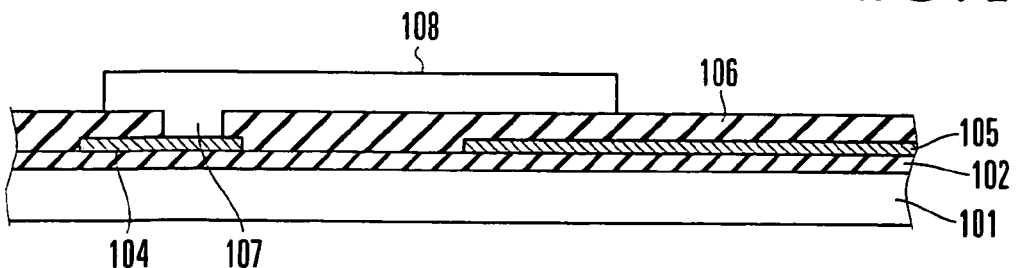
Figure 1D:
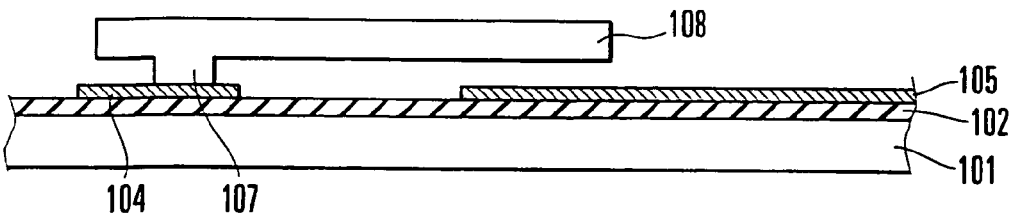
Figure 1E:
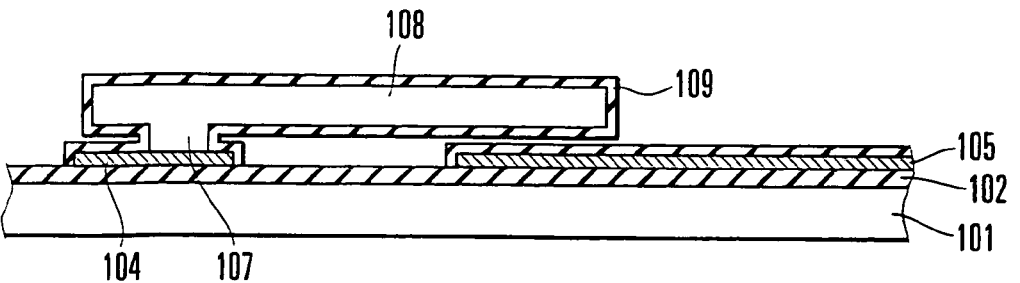
Figure 2A:
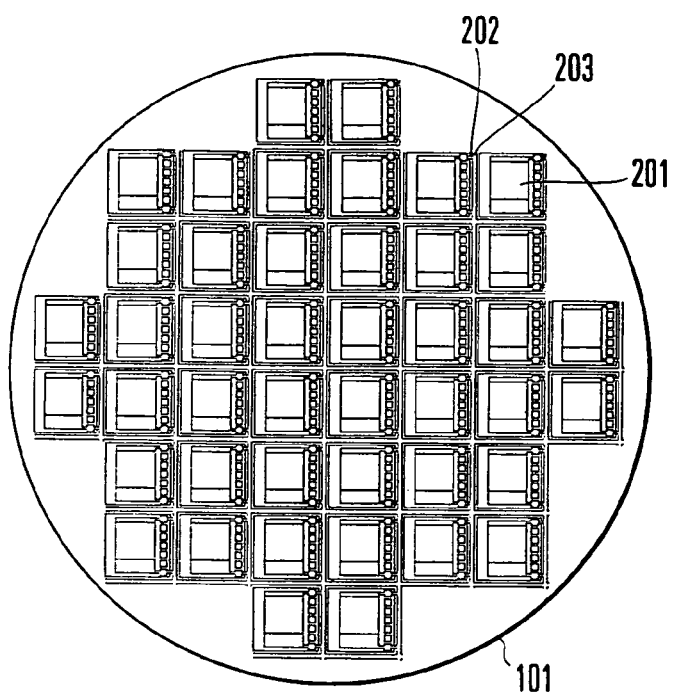
FIGS. 2A and 2B are plan views showing a chip layout state on a substrate 101.

FIGS. 1A to 1E schematically show part of a region serving as one chip on which a micromachine is formed. As shown in FIG. 2A, a plurality of chip regions 201 each having the electrode 104 and control electrode 105 are simultaneously manufactured in an aligned state on the substrate 101. In each chip region 201, the electrode 104 and control electrode 105 are connected via any interconnection of an interconnection layer arranged below the insulating film 102 to a pad portion (not shown) arranged around the chip region 201.

The chip regions 201 are separated from each other by cutting regions 202 used to cut out the chip regions 201, and are aligned at a predetermined interval.

Figure 2B:
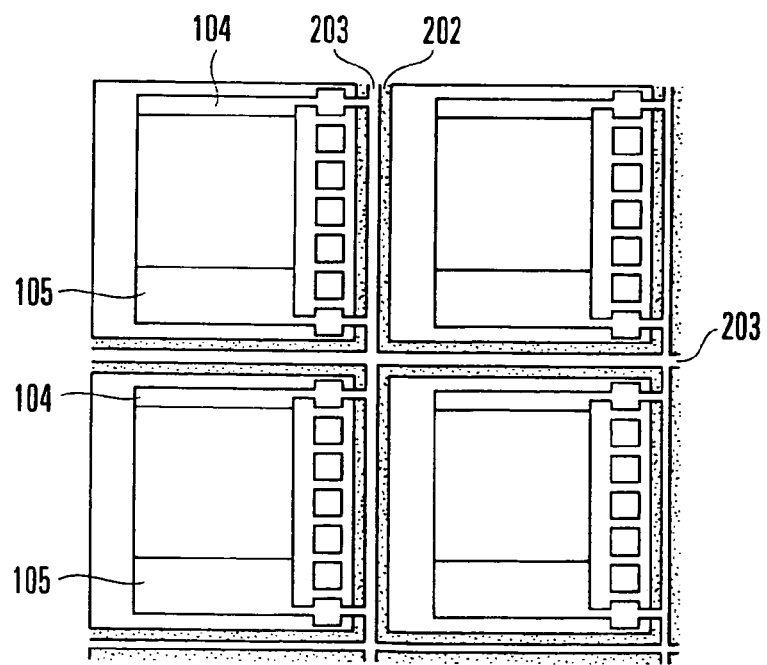

In the first embodiment, a common interconnection 203 is arranged in the cutting region 202, as shown in the enlarged plan view of FIG. 2B. The common interconnection 203 is electrically connected to the electrode 104 and control electrode 105 of each chip region 201. The electrode 104, control electrode 105, and common interconnection 203 can be connected via, e.g., the pad portion and any interconnection of the interconnection layer arranged below the insulating film 102.

Referring back to the manufacturing method, after the electrode 104 and control electrode 105 are formed, a silicon oxide film is deposited by CVD on the insulating film 102 including the electrode 104 and control electrode 105 in each chip region 201. After the silicon oxide film is formed, it is patterned into a sacrificial film 106 having an opening 106a where part of the electrode 104 is exposed, as shown in FIG. 1B.

Polysilicon is deposited on the sacrificial film 106 by CVD to form a polysilicon film so as to fill the opening 106a. After the polysilicon film is formed, it is processed by known lithography and etching into a support member 107 and actuator 108 which constitute a driving electrode, as shown in FIG. 1C. The support member 107 and actuator 108 are therefore made of polysilicon.

The sacrificial film 106 of silicon oxide is selectively removed by wet etching using a hydrofluoric acid solution, forming the actuator 108 (driving electrode) which is supported by the support member 107 on the electrode 104 and has a portion extending above the control electrode 105. By applying an electrical signal to the control electrode 105, the extending portion of the actuator 108 operates in a predetermined direction by the action of the electric field.

A polyimide film is formed at a predetermined portion by the following electrodeposition. The substrate 101 having the control electrode 105 and actuator 108, and a platinum counterelectrode are dipped in an electrodeposition polyimide solution (e.g., Q-ED-22-10 available from PI R&D). In this state, for example, a positive voltage is applied to the electrode 104 and control electrode 105 via the common interconnection 203 (FIGS. 2A and 2B), and a negative voltage is applied to the counterelectrode. That is, the electrode 104 and control electrode 105 serving as a positive pole, and the counterelectrode serving as a negative pole are dipped in the electrodeposition polyimide solution. Note that the positive and negative poles may be exchanged.

By applying voltages in this manner, a material (electrodeposition polyimide) dissolved in the electrodeposition polyimide solution is deposited on surfaces of the positive-voltage-applied control electrode 105, electrode 104, support member 107, and actuator 108 that are exposed in the solution. As a result, a polyimide film 109 having a film thickness of about several hundred nm to several ten_m is formed on the surfaces of the control electrode 105, electrode 104, support member 107, and actuator 108 that are exposed in the solution (FIG. 1E).

The material dissolved in the electrodeposition polyimide solution is not deposited on the surface of the insulating film 102 to which no positive voltage is applied, and is selectively deposited on a portion to which a positive voltage is applied. Consequently, the polyimide film 109 is selectively formed on the portion to which a positive voltage is applied. The film thickness of the formed polyimide film 109 can be controlled by the application voltage, voltage application time, and the like. In the first embodiment, the common interconnection 203 allows simultaneously forming the polyimide film 109 on chips formed on the substrate 101.

Electrodeposition polyimide will be explained.

Electrodeposition polyimide is synthesized by block copolymerization. Electrodeposition polyimide is prepared by introducing into a block co-polyimide chain a functional group which is electrically charged in an aqueous solution. Examples of the functional group are a carboxyl group and amino group.

Block co-polyimide is a stable solvent soluble material in an aqueous solution, and can be stably electrodeposited. For example, as for block co-polyimide having a carboxyl group, the carboxyl group changes into COO$^-$ in an aqueous solution, and functions as a negatively charged molecular chain. As for block co-polyimide having an amino group, the amino group changes into NH$_3^+$ in an aqueous solution, and functions as a positively charged molecular chain. In this fashion, electrodeposition polyimide is stably charged in an aqueous solution, and can be easily electrodeposited.

After the polyimide film 109 is formed by electrodeposition using electrodeposition polyimide, the substrate 101 is cut into respective chip regions 201 along the cutting regions 202. By cutting, the common interconnection 203 in each cutting region 202 is removed. In each cut-out chip region 201, the electrode 104 and control electrode 105 are electrically isolated from each other.

According to the first embodiment, the surface of the control electrode 105 and the actuator 108 which constitutes a driving electrode are covered with the insulating polyimide film 109. This can prevent fixation of the distal end of the actuator 108 and the control electrode 105.

In the first embodiment, each portion such as a polysilicon actuator which requires high-temperature processing is formed, and then the polyimide film is formed. The manufacturing method of the first embodiment need not execute high-temperature processing or the like after forming the polyimide film, and need not consider resistance to high temperature or the like.

The driving electrode (actuator) and control electrode are respectively made of polysilicon and Au/Cr in the first embodiment, but the present invention is not limited to this. The driving electrode and control electrode suffice to be conductors capable of forming a polyimide film by electrodeposition. Both the driving electrode and control electrode may be made of polysilicon. Alternatively, both the driving electrode and control electrode may be made of Au/Cr. The polyimide film is formed on both the driving electrode and control electrode in the above description, but the present invention is not limited to this. The polyimide film may be formed on either of the driving electrode and control electrode.

For example, only the control electrode 105 is connected to the common interconnection 203 arranged in the cutting region 202, and a positive voltage is applied to only the control electrode 105 via the common interconnection 203, thereby forming a polyimide film on only the control electrode by electrodeposition. Similarly, a positive voltage is applied to only the driving electrode, forming a polyimide film on only the driving electrode by electrodeposition.

Second Embodiment

The second embodiment of the present invention will be described.

Figure 3A:
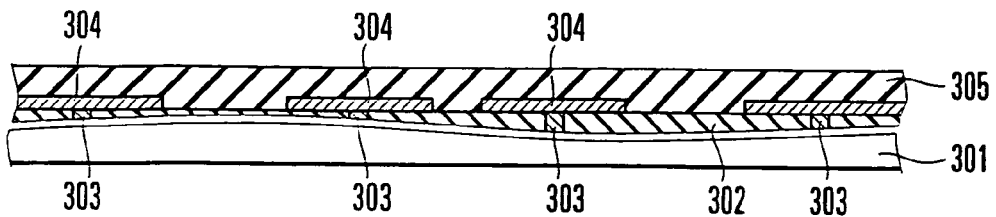
FIGS. 3A to 3P are sectional views showing an example of a micromachine manufacturing method according to the second embodiment of the present invention.

As shown in FIG. 3A, an active circuit (not shown) which constitutes a control circuit is formed on a semiconductor substrate 301 made of a semiconductor such as silicon. An interlayer dielectric film 302 is then formed from a silicon oxide. A connection port is formed in the interlayer dielectric film 302, and an interconnection layer 304 is formed and connected to a lower interconnection via a connection electrode 303 through the connection port.

This structure can be formed by known photolithography and etching. For example, the active circuit can be fabricated by a CMOS LSI process. The connection electrode 303 and interconnection layer 304 can be formed by forming an Au/Ti metal film and processing it. The metal film is adjusted such that the lower Ti layer has a film thickness of about 0.1_m and the upper Au layer has a film thickness of about 0.3_m.

The metal film is formed as follows. An Au/Ti film is formed on a silicon oxide film by sputtering, vapor deposition, or the like. A predetermined resist pattern is formed on the formed film by photolithography. At the same time, a resist pattern for forming an electrode interconnection, a connection portion used to adhere a mirror substrate to be described later, and a wire bonding pad is also formed. These resist patterns are used as a mask, the Au/Ti film is selectively removed by wet etching, and the resist patterns are removed, forming the interconnection layer 304. At this time, an electrode interconnection, a connection portion used to connect a mirror substrate to be described later, and a wire bonding pad are formed on the interconnection layer 304.

Figure 3B:
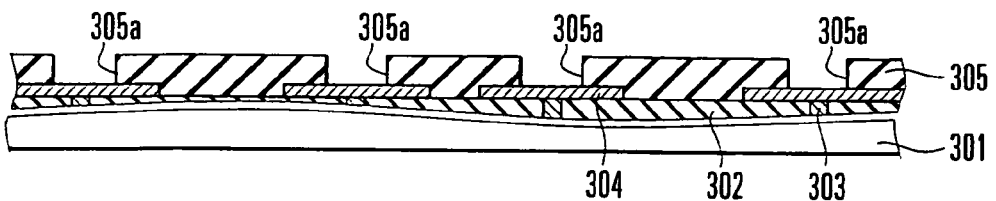
Figure 3C:
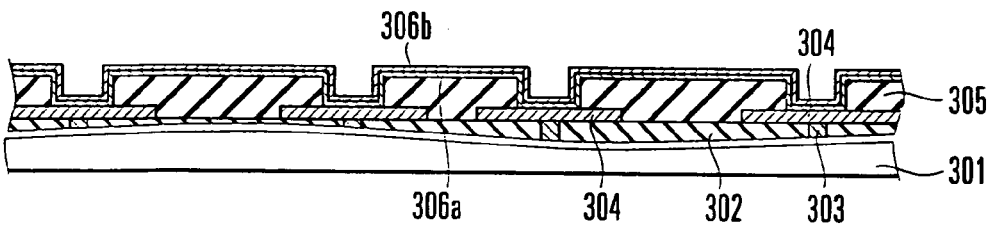
Figure 3D:
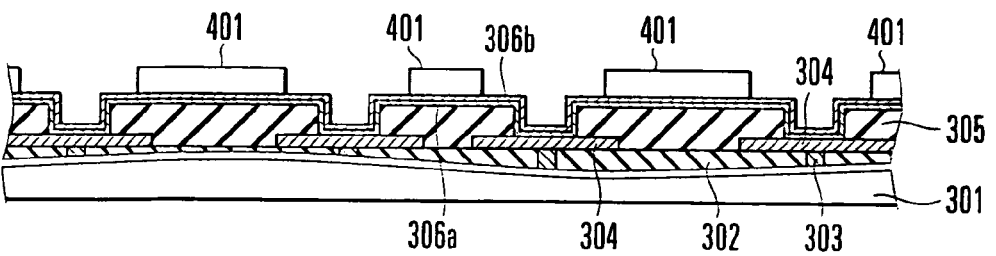
Figure 3E:
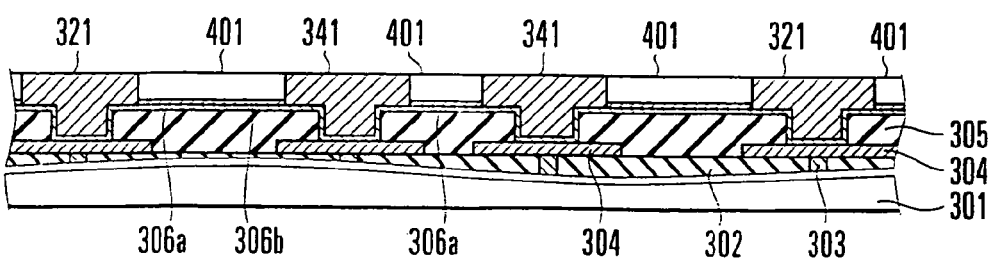
Figure 3F:
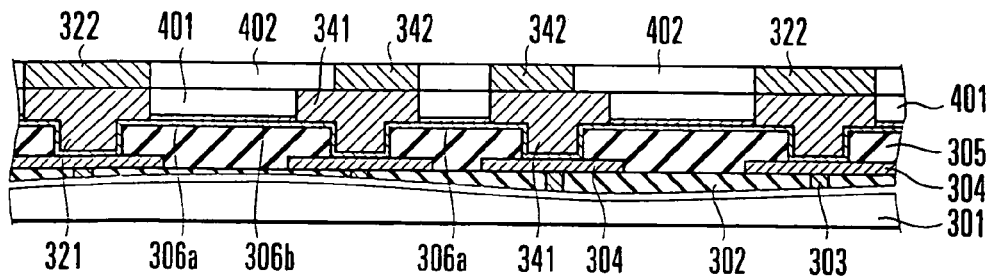
Figure 3G:
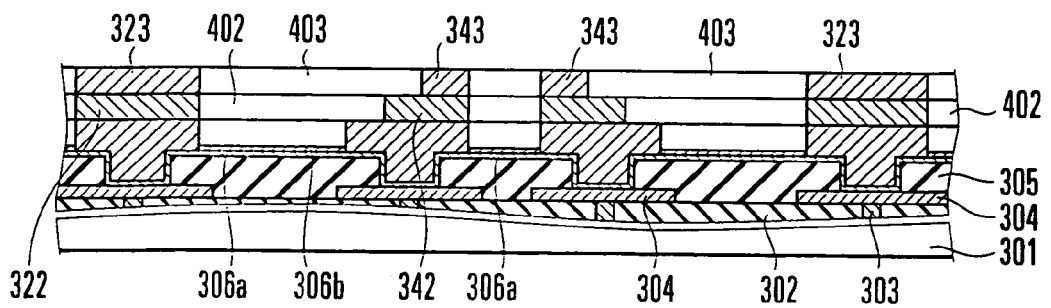
Figure 3H:
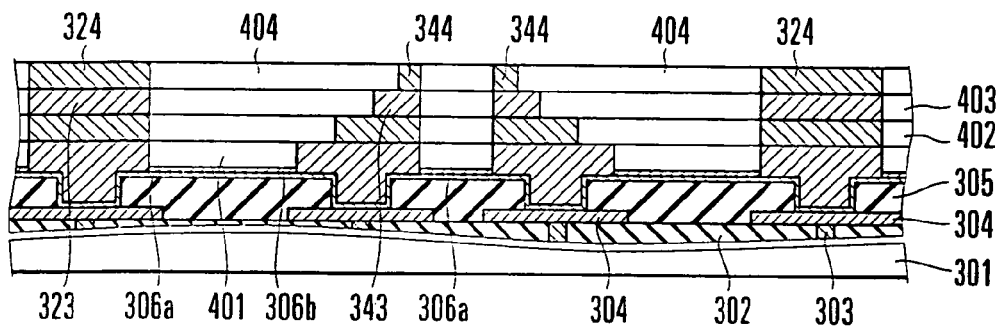
Figure 3I:
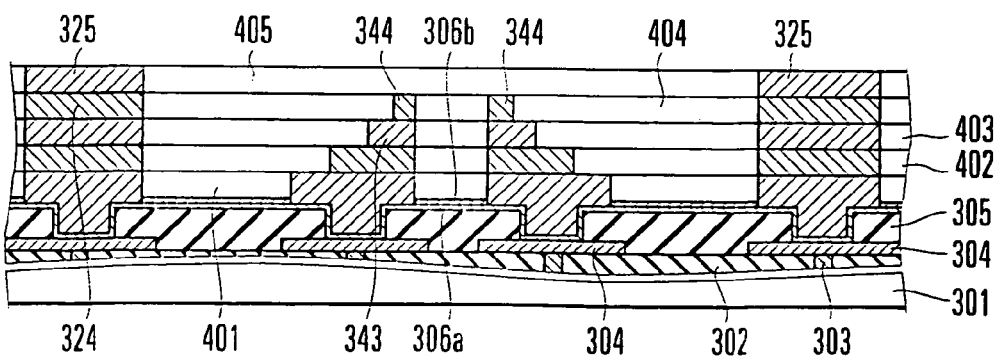
Figure 3J:
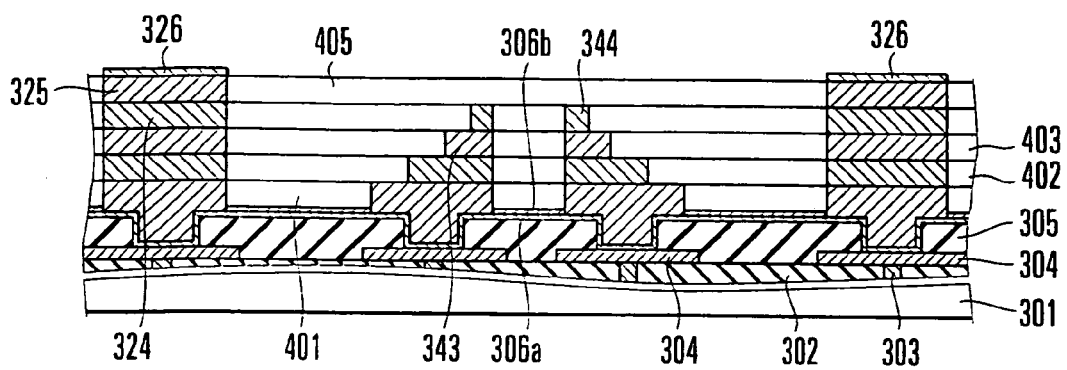
Figure 3K:
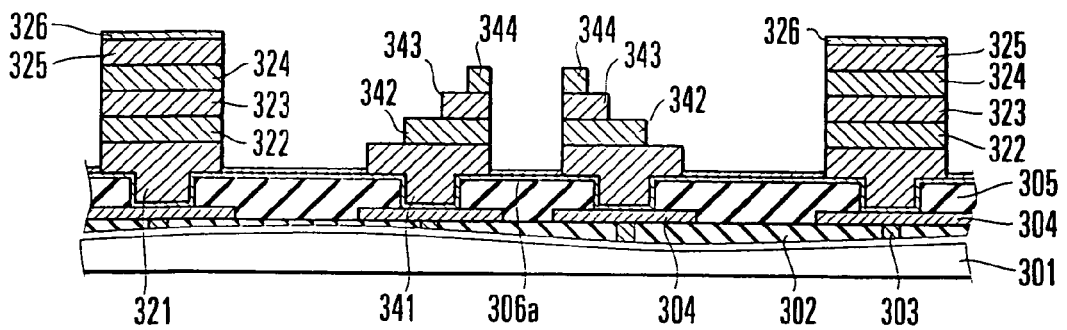
Figure 3L:
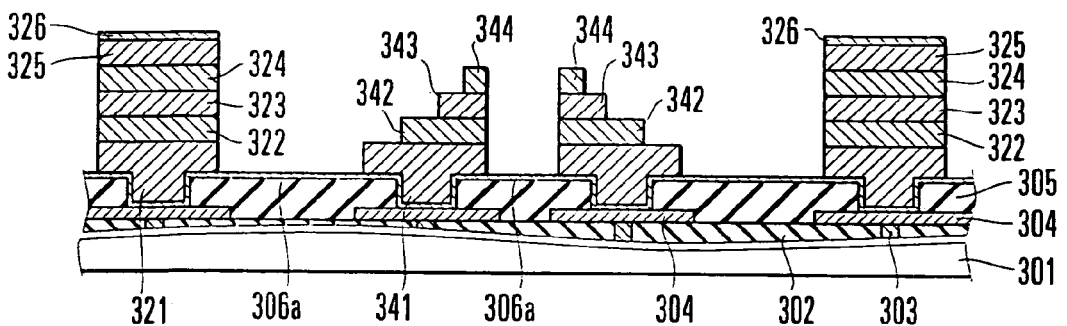
Figure 3M:
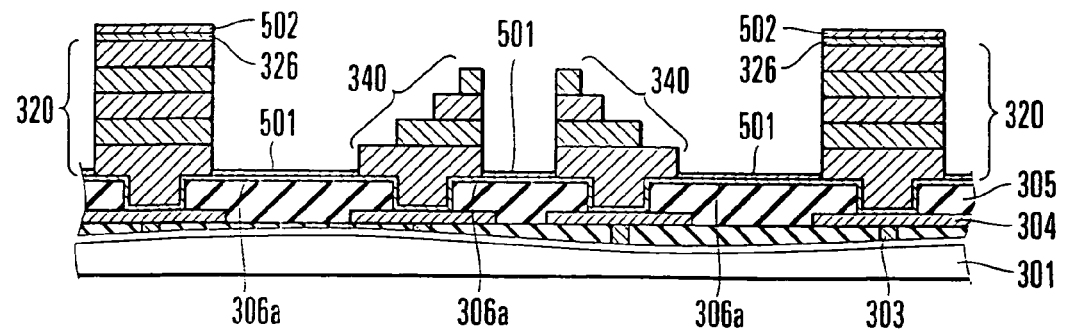
Figure 3N:
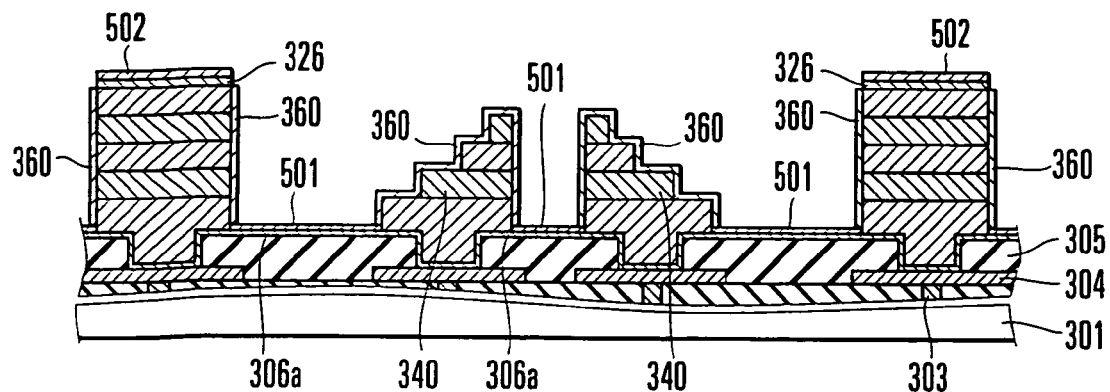
Figure 3O:
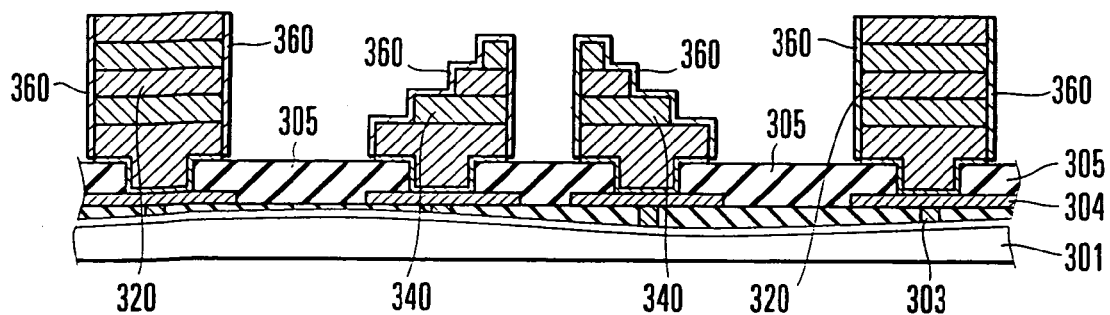
Figure 3P:
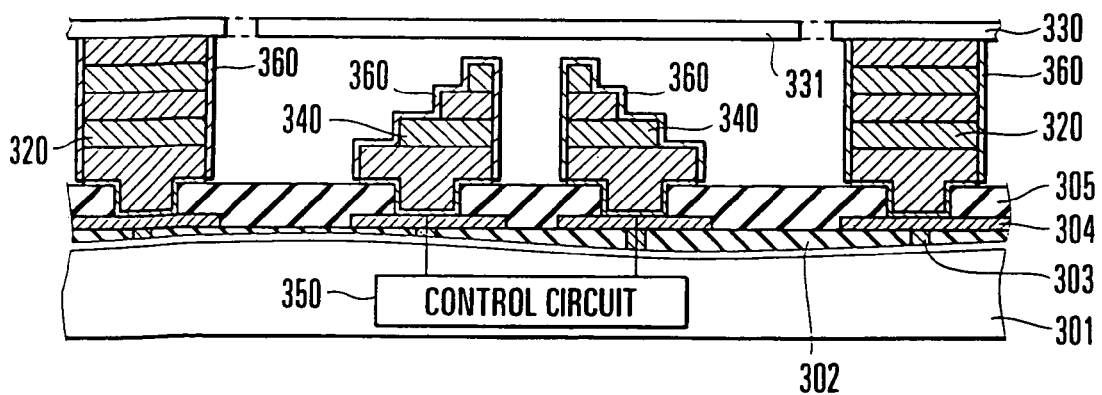
Figure 4A:
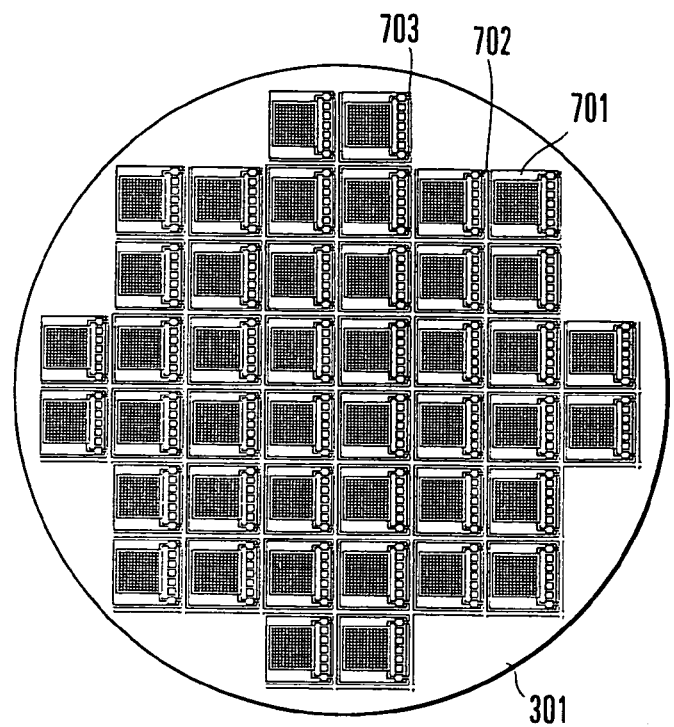
FIGS. 4A and 4B are plan views showing a chip layout state on a semiconductor substrate 301.

FIGS. 3A to 3P schematically show part of a region serving as one chip on which a micromachine is formed. As shown in FIG. 4A, a plurality of chip regions 701 each having the interconnection layer 304 and the like are simultaneously manufactured in an aligned state on the semiconductor substrate 301. In each chip region 701, the interconnection layer 304 is connected to a pad portion arranged around the chip region 701. The chip region 701 are aligned at a predetermined interval, and cutting regions 702 used to cut out the chip regions 701 are interposed between adjacent chip regions 701.

Figure 4B:
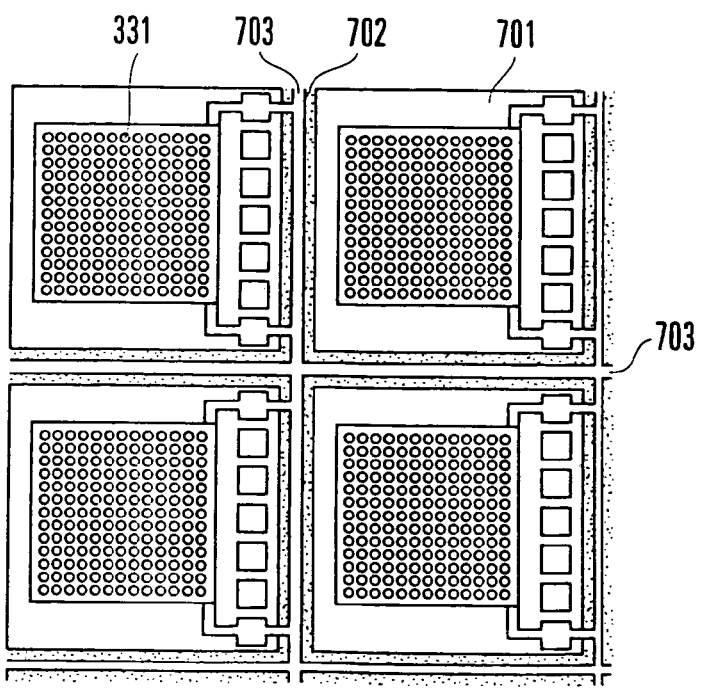

In the second embodiment, a common interconnection 703 is arranged in the cutting region 702, as shown in the enlarged plan view of FIG. 4B. The common interconnection 703 is electrically connected to the interconnection layer of each chip region 701. The interconnection layer 304 and common interconnection 703 can be connected via, e.g., the pad portion.

As described above, after the interconnection layer 304 and common interconnection 703 are formed, an interlayer dielectric film 305 which covers the interconnection layer 304 is formed in each chip region. The interlayer dielectric film 305 can be formed from a polyimide film prepared by applying polybenzoxazole serving as a photosensitive organic resin to a film thickness of about several_m. The interlayer dielectric film 305 may be formed from another insulating material.

As shown in FIG. 3B, an opening 305a is formed in the interlayer dielectric film 305 so as to expose a predetermined portion of the interconnection layer 304. When the interlayer dielectric film 305 is formed from a photosensitive organic resin, as described above, a pattern is formed by exposure and developing so as to open the region of the opening 305a. After the pattern is formed, it is annealed to harden the film, thereby forming the interlayer dielectric film 305 having the opening 305a.

As shown in FIG. 3C, e.g., a Ti lower seed layer 306a having a film thickness of about 0.1_m is formed to cover the interlayer dielectric film 305 including the opening 305a. In addition, e.g., an Au upper seed layer 306b having a film thickness of about 0.3_m is formed on the lower seed layer 306a.

As shown in FIG. 3D, a sacrificial pattern 401 having a film thickness of about 17_m at a flat portion is formed. The sacrificial pattern 401 can be formed by processing, e.g., a polybenzoxazole film serving as a photosensitive organic resin by photolithography.

For example, polybenzoxazole is applied to form a photosensitive polyimide film. The formed polyimide image is exposed to a predetermined optical image by a contact aligner using a photomask or a stepper using a reticle, thus forming photosensitive portions. The formed photosensitive portions correspond to portions where a mirror electrode pattern, a connection portion for connecting a mirror substrate, and a portion for forming a wire bonding pad are opened. After the photosensitive portions are formed, they are dissolved in a developing solution, forming the sacrificial pattern 401 having desired opening regions.

As shown in FIG. 3E, Au metal patterns 321 and 341 are formed by electroplating on the upper seed layer 306*b* exposed in the openings of the sacrificial pattern 401. The metal patterns 321 and 341 are formed to the same thickness as that of the sacrificial pattern 401. At this time, the surfaces of the metal patterns 321 and 341 and the sacrificial pattern 401 are made flat so as to become almost flush with each other. The Au metal patterns 321 and 341 form an integral structure together with the underlying Au upper seed layer 306*b*.

As shown in FIG. 3F, a sacrificial pattern 402 having a film thickness of about 17_m at a flat portion is formed on the metal patterns 321 and 341 by the above-described method. Au metal patterns 322 and 342 are formed on the metal patterns 321 and 341 which are exposed in the openings of the formed sacrificial pattern 402. The metal patterns 322 and 342 suffice to be formed by electroplating. The metal patterns 322 and 342 are formed to the same thickness as that of the sacrificial pattern 402.

As shown in FIG. 3G, a sacrificial pattern 403 having a film thickness of about 17_m at a flat portion is formed on the metal patterns 322 and 342 by the above-described method. Au metal patterns 323 and 343 are formed on the metal patterns 322 and 342 which are exposed in the openings of the sacrificial pattern 403. The metal patterns 323 and 343 suffice to be formed by electroplating. The metal patterns 323 and 343 are formed to the same thickness as that of the sacrificial pattern 403.

As shown in FIG. 3H, a sacrificial pattern 404 having a film thickness of about 17_m at a flat portion is formed on the metal patterns 323 and 343 by the above-described method. Au metal patterns 324 and 344 are formed on the metal patterns 323 and 343 which are exposed in the openings of the formed sacrificial pattern 404. The metal patterns 324 and 344 suffice to be formed by electroplating. The metal patterns 324 and 344 are formed to the same thickness as that of the sacrificial pattern 403.

As shown in FIG. 3I, a sacrificial pattern 405 having a film thickness of about 17_m at a flat portion is formed on the metal patterns 324 and 344 by the above-described method. An Au metal pattern 325 is formed on the metal pattern 324 which is exposed in the openings of the formed sacrificial pattern 405. The metal pattern 325 suffices to be formed by electroplating. The metal pattern 325 is formed to the same thickness as that of the sacrificial pattern 405.

In this case, no opening is formed in the sacrificial pattern 405 on the metal pattern 344, and the metal pattern 344 is covered with the sacrificial pattern 405.

Ti is deposited to a film thickness of about 50 nm on the surface of the sacrificial pattern 405 including the surface of the metal pattern 325, forming a metal film. The metal film is processed by known photolithography and etching, forming a metal film 326 which covers the upper surface of the Au metal pattern 325, as shown in FIG. 3J.

The sacrificial patterns 401, 402, 403, 404, and 405 are ashed away by using, e.g., an ozone asher. As a result, as shown in FIG. 3K, a structure of the metal patterns 321, 322, 323, 324, and 325, and a structure of the metal patterns 341, 342, 343, and 344 are formed with a space between these structures.

The Au upper seed layer 306*b* is selectively etched away by wet etching using an iodine-ammonium iodide solution with the metal patterns 321 and 341 as a mask. As shown in FIG. 3L, the lower seed layer 306*a* is exposed between the metal patterns 321 and 341. The obtained structure is exposed to an oxygen plasma to oxidize the exposed portion of the Ti lower seed layer 306*a* and the surface of the metal film 326, forming insulating films 501 and 502, as shown in FIG. 3M. The metal patterns 321, 322, 323, 324, and 325 constitute support members 320, whereas the metal patterns 341, 342, 343, and 344 constitute control electrodes 340.

The semiconductor substrate 301 having the support members 320 and control electrodes 340, and a platinum counter electrode are dipped in an electrodeposition polyimide solution (e.g., Q-ED-22-10 available from PI R&D). A positive voltage is applied to each support member 320 and control electrode 340 via the common interconnection 703 (FIGS. 4A and 4B) and interconnection layer 304, and a negative voltage is applied to the counterelectrode. That is, the support member 320 and control electrode 340 serving as a positive pole, and the counterelectrode serving as a negative pole are dipped in the electrodeposition polyimide solution.

A material dissolved in the electrodeposition polyimide solution is deposited on surfaces of the positive-voltage-applied control electrode 340 and support member 320 that are exposed in the solution. As a result, a polyimide film 360 having a film thickness of about several hundred nm to several ten_m is formed on the surfaces of the control electrode 340 and support member 320 (FIG. 3N). The material dissolved in the electrodeposition polyimide solution is not deposited on the surfaces of the insulating films 501 and 502 to which no positive voltage is applied, and is selectively deposited on a portion to which a positive voltage is applied. Consequently, the polyimide film is selectively formed on the portion to which a positive voltage is applied.

The film thickness of the formed polyimide film can be controlled by the application voltage, voltage application time, and the like. In the second embodiment, the common interconnection 703 allows simultaneously forming the polyimide film 360 on the support member 320 and control electrode 340 of each chip formed on the semiconductor substrate 301.

The Ti lower seed layer 306*a* and metal film 326 are dissolved and removed by wet etching using a hydrofluoric acid solution. At the same time, the insulating films 501 and 502 are also etched away. As a result, as shown in FIG. 3O, the polyimide film 360 is uniformly formed on the surfaces of the support member 320 and control electrode 340.

A mirror substrate 330 on which a mirror 331 is pivotally arranged via a coupling portion (not shown) is connected and fixed on the support members 320, forming an optical switching element, as shown in FIG. 3P. The mirror substrate 330 suffices to be connected and fixed onto the support members 320 with, e.g., a solder or anisotropic conductive adhesive. The mirror 331 is, e.g., a disk with a diameter of about 500_m. As part of the above-mentioned active circuit, a control circuit 350 is formed for each element on the semiconductor substrate 301 below the interlayer dielectric film 302.

Thereafter, the semiconductor substrate 301 is cut into respective chip regions 701 along the cutting regions 702 (FIGS. 4A and 4B). By cutting, the common interconnection 703 in each cutting region 702 is removed. In the cut-out chip regions 701, the interconnection layers 304 of different chips are electrically isolated from each other.

As described above, according to the second embodiment, the surface of the control electrode 340 is covered with the insulating polyimide film 360. This can prevent fixation of the upper portion of the control electrode 340 and the lower surface of the mirror 331.

The second embodiment can uniformly form a polyimide film on the surface of a complicated structure without using many photomasks and increasing the number of steps even if a structure having a large step such as the control electrode 340 is formed. As shown in FIG. 3M, Ti film portions are oxidized to form the insulating films 501 and 502. In this region, no material in the electrodeposition polyimide solution is electrodeposited, and no polyimide film is formed. It is therefore easy to prevent formation of a polyimide film on the upper surface of the support member 320.

In the second embodiment, the polyimide film 360 is formed on the support member 320 in addition to the control electrode 340. However, the present invention is not limited to this, and the polyimide film 360 may be formed on only the control electrode 340. For example, a positive voltage is applied to only the control electrode 340 to electrodeposit polyimide, thereby forming the polyimide film 360 on only the control electrode 340.

In the above description, four metal patterns are formed to form a control electrode, five metal patterns are formed to form a support member, and the support member is formed higher than the control electrode. However, the present invention is not limited to this. Metal patterns formed on the same layer for the control electrode and support member are formed into the same thickness. If at least one more metal pattern is formed for the support member, the support member can be formed higher than the control electrode. For example, the support member is formed from two metal patterns, and the control electrode is formed from one metal pattern. When the support member is formed higher, the mirror can pivot even in the presence of the control electrode below the mirror fixed to the support member.

As has been described above, according to the present invention, either electrode of a micromachine is used as a positive pole, and electrodeposition polyimide is electrodeposited. According to the present invention, the polyimide film is interposed between a stationary electrode and a movable electrode.

According to the present invention, a protective film can be formed more easily than the prior art on the surface of a structure arranged in a complicated three-dimensional structure. Formation of the protective film prevents a movable electrode from coming into contact with a stationary electrode when the movable electrode moves. Smooth operation can continue without any sticking caused by contact.

In the present invention, a common interconnection is prepared in a cutting region where a plurality of chip regions for forming micromachines are separated. Hence, the present invention can simultaneously apply a potential to the electrodes of the chip regions by connecting either electrode of each micromachine to the common interconnection.

What is claimed is:

1. A micromachine manufacturing method comprising:
   forming a control electrode on a substrate;
   forming on the substrate a driving electrode which is insulated from the control electrode and has a portion extending above the control electrode; and
   dipping the control electrode and the driving electrode in an electrodeposition polyimide solution, and applying a positive voltage to at least one of the control electrode and the driving electrode to form a polyimide film by electrodeposition on at least one of a surface of the control electrode and a surface of the driving electrode.

2. A micromachine manufacturing method comprising:
   forming a control circuit from a plurality of elements on a semiconductor substrate;
   forming an interlayer dielectric film on the semiconductor substrate to cover the control circuit;
   forming a seed layer on the interlayer dielectric film;
   forming a first sacrificial pattern having a first opening region and a plurality of second opening regions on the seed layer;
   forming first and second metal patterns having substantially the same film thickness as a film thickness of the first sacrificial pattern by plating on the seed layer exposed in the first and second regions;
   forming a second sacrificial pattern having a third opening region above the first region on the first sacrificial pattern and the second metal pattern;
   forming a third metal pattern having substantially the same film thickness as a film thickness of the second sacrificial pattern by plating on a surface of the first metal pattern exposed in the third region;
   after forming the third metal pattern, removing the first and second sacrificial patterns;
   after removing the first and second sacrificial patterns, dipping in an electrodeposition polyimide solution a plurality of control electrodes which are formed from a plurality of second metal patterns and separated on the interlayer dielectric film, and applying a positive voltage to the control electrodes to form polyimide films on surfaces of the control electrodes by electrodeposition;
   after forming the polyimide films, selectively removing the seed layer by using the first and second metal patterns as a mask, thereby forming a column from a multilayered structure of the first and third metal patterns together with the control electrodes;
   preparing a conductive mirror substrate on which mirrors are arranged in a plurality of opening regions and pivotally coupled via coupling portions; and
   connecting and fixing the mirror substrate on the column so as to arrange the plurality of mirrors above the plurality of control electrodes at an interval in correspondence with each other,
   wherein the control electrodes are so connected as to allow applying a predetermined signal by the control circuit.

3. A method according to claim 2, wherein
   the seed layer is formed from a gold upper seed layer and a titanium lower seed layer,
   the first to third metal patterns are formed by plating gold,
   a titanium metal film is formed on the third metal pattern before the first and second sacrificial patterns are removed,
   the first and second sacrificial patterns are removed after the metal film is formed,
   the upper seed layer exposed between the first and second metal patterns after removal of the first and second sacrificial patterns is selectively removed using the first and second metal patterns as a mask, thereby exposing part of the lower seed layer,
   polyimide is electrodeposited after an oxide film is formed on the exposed lower seed layer and a surface of the metal film, the oxide film is removed by removing the lower seed layer and the metal film after the polyimide film is formed, and the mirror substrate is connected and fixed to the column after the oxide film is removed.

4. A micromachine manufacturing method comprising:

forming on a substrate a plurality of chip regions which are separated by a cutting region;

forming a common interconnection in the cutting region;

forming control electrodes on the substrate for the respective chip regions;

forming, on the substrate for the respective chip regions, driving electrodes which are insulated from the control electrodes, have portions extending above the control electrodes, and are connected to the common interconnection; and dipping the control electrodes and the driving electrodes in an electrodeposition polyimide solution, and applying a voltage to the common interconnection to form a polyimide film by electrodeposition on either or both of a surface of each driving electrode and a surface of each control electrode.

5. A micromachine manufacturing method comprising:

forming on a semiconductor substrate a plurality of chip regions which are separated by a cutting region;

forming a common interconnection in the cutting region;

forming on the semiconductor substrate for each chip region a control circuit from a plurality of elements and an interconnection layer connected to the common interconnection;

forming an interlayer dielectric film on the semiconductor substrate to cover the control circuit and the interconnection layer;

forming on the interlayer dielectric film a seed layer which is partially connected to the interconnection layer;

forming a first sacrificial pattern having a first opening region and a plurality of second opening regions on the seed layer;

forming first and second metal patterns having substantially the same film thickness as a film thickness of the first sacrificial pattern by plating on the seed layer exposed in the first and second regions;

forming a second sacrificial pattern having a third opening region above the first region on the first sacrificial pattern and the second metal pattern;

forming a third metal pattern having substantially the same film thickness as a film thickness of the second sacrificial pattern by plating on a surface of the first metal pattern exposed in the third region;

after forming the third metal pattern, removing the first and second sacrificial patterns;

after removing the first and second sacrificial patterns, dipping in an electrodeposition polyimide solution a plurality of control electrodes which are formed from a plurality of second metal patterns and separated on the interlayer dielectric film, and applying a voltage to the interconnection layer to form polyimide films on surfaces of the control electrodes by electrodeposition;

after forming the polyimide films, selectively removing the seed layer by using the first and second metal patterns as a mask, thereby forming a support member from a multilayered structure of the first and third metal patterns together with the control electrodes;

preparing a conductive mirror semiconductor substrate on which mirrors are arranged in a plurality of opening regions and pivotally coupled via coupling portions; and connecting and fixing the mirror semiconductor substrate on the support member so as to arrange the plurality of mirrors above the plurality of control electrodes at an interval in correspondence with each other, wherein the control electrodes are so connected as to allow applying a predetermined signal by the control circuit.

6. The method according to claim 5, wherein the seed layer is formed from a gold upper seed layer and a titanium lower seed layer, the first to third metal patterns are formed by plating gold, a titanium metal film is formed on the third metal pattern before the first and second sacrificial patterns are removed, the first and second sacrificial patterns are removed after the metal film is formed, the upper seed layer exposed between the first and second metal patterns after removal of the first and second sacrificial patterns is selectively removed using the first and second metal patterns as a mask, thereby exposing part of the lower seed layer, polyimide is electrodeposited after an oxide film is formed on the exposed lower seed layer and a surface of the metal film, the oxide film is removed by removing the lower seed layer and the metal film after the polyimide film is formed, and the mirror semiconductor substrate is connected and fixed to the support member after the oxide film is removed.

7. The method according to claim 6, further comprising:

removing the cutting region together with the common interconnection, thereby cutting the substrate into the plurality of chip regions.

8. The method according to claim 7, further comprising:

removing the cutting region together with the common interconnection to cut the semiconductor substrate into the plurality of chip regions.

* * * * *